US006968753B2

(12) United States Patent
Tzeng et al.

(10) Patent No.: US 6,968,753 B2
(45) Date of Patent: Nov. 29, 2005

(54) VIBRATION-DAMPENING BASE FOR BALL-TYPE LEAD SCREW OF LOAD PORT TRANSFER SYSTEM

(75) Inventors: Huan-Liang Tzeng, Hsin-chu (TW); Tzu-Chieh Chou, Chung Li (TW); Ping-Jen Cheng, Chung Li (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 375 days.

(21) Appl. No.: 10/143,625

(22) Filed: May 9, 2002

(65) Prior Publication Data

US 2003/0234141 A1    Dec. 25, 2003

(51) Int. Cl.[7] ............................ F16H 27/02; B65G 1/00
(52) U.S. Cl. ............... 74/89.36; 74/89.42; 414/331.14; 414/940
(58) Field of Search ............................ 74/89.36, 89.42, 74/440, 441, 443, 424.81, 424.82; 414/331.14–331.18, 414/217.1, 940, 939; 187/210, 233, 271

(56) References Cited

U.S. PATENT DOCUMENTS

| 4,671,127 A | * | 6/1987 | Yamaguchi et al. | ........ 74/89.36 |
| 4,966,045 A | * | 10/1990 | Harney | .................... 74/424.96 |
| 5,172,601 A | * | 12/1992 | Siegrist et al. | ............. 74/89.36 |
| 5,271,702 A | * | 12/1993 | Dobbs et al. | .......... 414/223.01 |
| 5,527,390 A | * | 6/1996 | Ono et al. | ................... 118/719 |
| 5,538,373 A | * | 7/1996 | Kirkham | ..................... 409/131 |
| 5,674,039 A | * | 10/1997 | Walker et al. | ......... 414/222.05 |
| 6,573,198 B2 | * | 6/2003 | Boonstra et al. | ............ 438/795 |
| 6,655,898 B1 | * | 12/2003 | Liu-Barba et al. | .......... 414/673 |

* cited by examiner

Primary Examiner—David M. Fenstermacher
(74) Attorney, Agent, or Firm—Tung & Associates

(57) ABSTRACT

A vibration-dampening base for a ball-type lead screw of a load port transfer system is disclosed. A load port transfer system includes a vertical arm drive motor assembly, a ball-type lead screw, and a vibration-dampening base connecting the vertical arm drive motor assembly to the ball-type lead screw. The vibration-dampening case can include a cross member into which the ball-type lead screw is disposed, one or more pillar members supporting the cross member, and one or more support stands. Each support stand supports a corresponding one of the one or more pillar members.

19 Claims, 4 Drawing Sheets

VIBRATION-DAMPENING BASE FOR BALL-TYPE LEAD SCREW OF LOAD PORT TRANSFER SYSTEM

FIELD OF THE INVENTION

This invention relates generally to pods for transferring semiconductor wafers, and more particularly to transfer systems for such pods and their associated load port transfer systems.

BACKGROUND OF THE INVENTION

The fabrication of semiconductor devices on semiconductor wafers requires that the semiconductor wafers be processed in a variety of different manners. Photolithography, chemical mechanical polishing (CMP), metal deposition, and so on, are all processes performed on semiconductor wafers in precise degrees to fabricate semiconductor devices. Usually, each of these different processes is performed using a different piece of semiconductor fabrication equipment. Therefore, a transport system is used to transport the semiconductor wafers among the different pieces of semiconductor fabrication equipment to achieve semiconductor device fabrication. Usually the semiconductor wafers are transported in pods.

FIG. 1 shows a top view of a traditional pod transport system 100. The system 100 particularly includes a conveyor belt 104 on which the pods may be transported among various stations 102a, 102b, . . . , 102n. Each of these stations 102a, 102b, . . . , 102n may be a separate piece of semiconductor fabrication equipment, a storage place to store pods and their semiconductor wafers, and so on. Overhead transfer (OHT) units 106 are able to move the pods vertically. The OHT units 106 are also referred to as OHT grippers, in that they grip the pods.

One particular area 108 of the system 100 of FIG. 1 is shown in more detail in a side view in FIG. 2. One of the OHT units 106 has a pod 202a that it is vertically lowering onto one of the load ports 204. One of the robot arms 208 has lowered on its vertical axis 206 to pick up the pod 202b that has already been lowered onto one of the load ports 204. The other of the robot arms 208 has risen on its vertical axis 206 to deposit the pod 202c onto one of the conveyor belts 104. In this way, pods 202 are moved from the OHT units 106 to the load ports 204, and ultimately to the conveyor belts 104. Furthermore, the OHT units 106 can vertically raise the pods 202 from the load ports 204.

A load port transfer system is used in conjunction with the load ports 204 to transfer wafer cassettes from the pods 202 to a process tool load position. The load port transfer system is more specifically a robotics load port transfer system. The transfer system operates under the control of a process tool computer, a host computer, or a user. FIG. 3 shows a side view of a load port transfer system 300 that is available from Asyst Technologies, Inc., of Fremont, Calif. The load port transfer system 300 specifically includes a lead screw mounting casting 302, a lead nut housing 304, a sensor rod 306, a lead screw 308, a vertical arm drive motor assembly 310, and a lower flag actuator 312.

The vertical arm drive motor assembly 310 controls the raising and the lowering of the lead screw 308, which can cause a platform 314 of the load port transfer system 300 to rise and descend. Wafer cassettes may be placed on the platform 314 for loading and unloading. The sensor rod 306 determines where the platform 314 is currently located. The lead screw 308 can have the associated lead screw mounting casting 302 and the leading nut housing 304. The lower flag actuator 312 may work in conjunction with the motor assembly 310 and/or the sensor rod 306.

A difficulty with the load port transfer system 300 is that the lead screw 308 may vibrate when the vertical arm drive motor assembly 310 is functioning. Such vibration may cause damage to the semiconductor wafers in the cassettes being transported in a worst-case scenario. However, at the very least, such vibration can cause the load port transfer system 300 to fail over time. That is, the vibration lessens the lifetime of the load port transfer system 300, and decreases its reliability.

A limited solution has been to use a ball-type lead screw as the lead screw 308. While this decreases vibration somewhat, vibration is still a problem. Therefore, there is a need to overcome these disadvantages associated with the load port transfer system 300. There is a need to further dampen vibration of the lead screw 308, even where the lead screw 308 is a ball-type lead screw. Such dampening should improve reliability and increase the operating life of the load port transfer system. For these and other reasons, therefore, there is a need for the present invention.

SUMMARY OF THE INVENTION

The invention relates to a vibration-dampening base for a ball-type lead screw of a load port transfer system. A load port transfer system includes a vertical arm drive motor assembly, a ball-type lead screw, and a vibration-dampening base connecting the vertical arm drive motor assembly to the ball-type lead screw. The vibration-dampening case can include a cross member into which the ball-type lead screw is disposed, one or more pillar members supporting the cross member, and one or more support stands. Each support stand supports a corresponding one of the one or more pillar members.

Embodiments of the invention provide for advantages over the prior art. The vibration-dampening base successfully and substantially eliminates vibrations of the ball-type lead screw. Use of the vibration-dampening base means that reliability of the load port transfer system is improved. The operating life of the load port transfer system is also lengthened. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
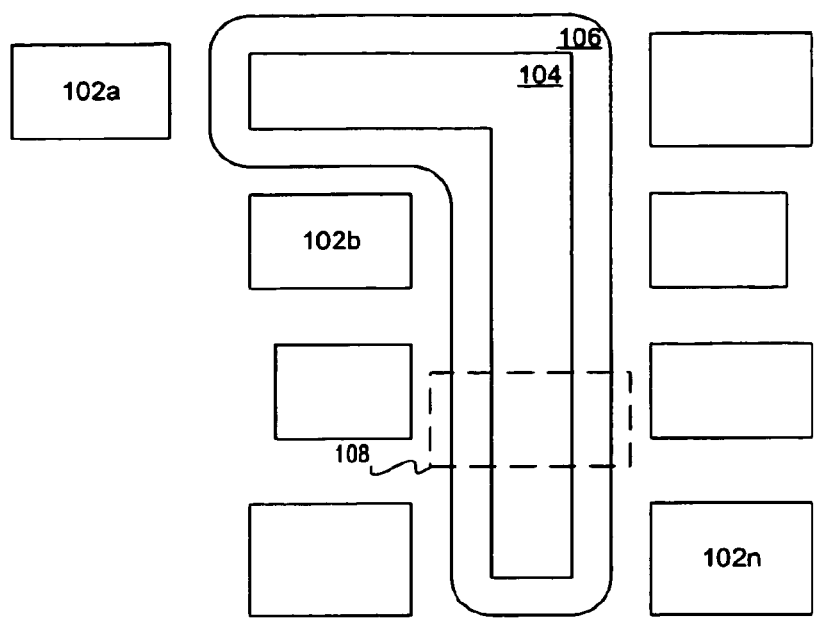
FIG. 1 is a diagram of a top view of a pod transfer system according to the prior art. The pod transfer system includes conveyors and overhead transfer (OHT) units for moving pods of semiconductor wafers to different semiconductor fabrication equipment.
Figure 2:
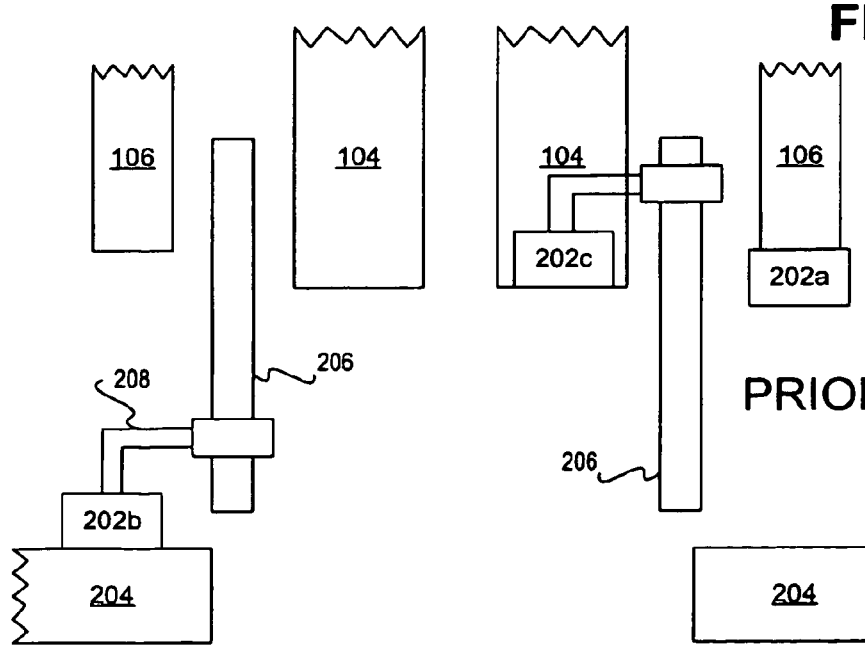
FIG. 2 is a diagram of a side view of the pod transfer system of FIG. 1, in which the OHT units transport pods vertically to and from load ports.
Figure 3:
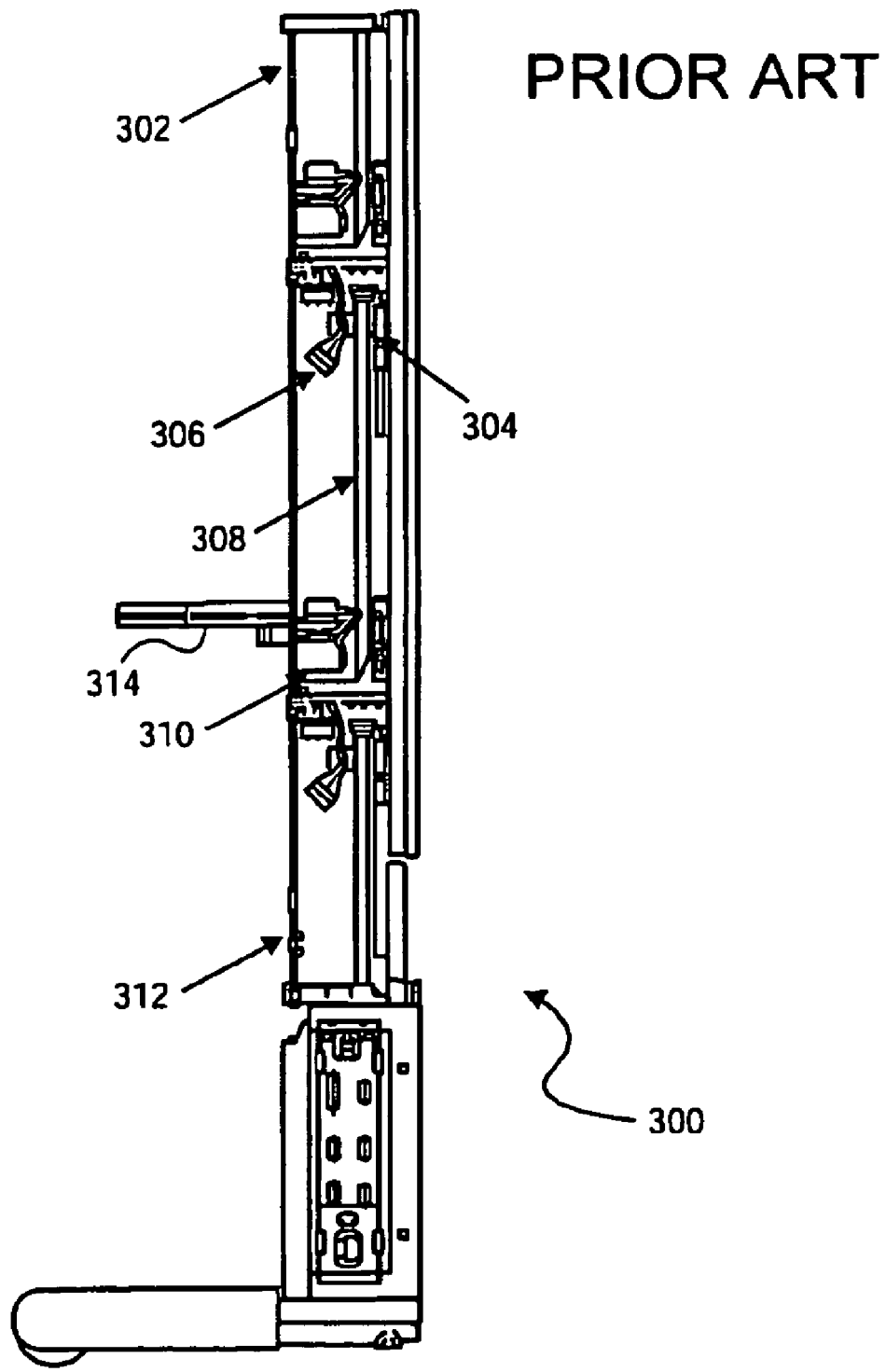
FIG. 3 is a diagram of a side view of a load port transfer system for transferring semiconductor wafer cassettes to and from the load ports of the pod transfer system of FIGS. 1 and 2. Embodiments of the invention may be implemented in conjunction with the load port transfer system of FIG. 3.
Figure 4:
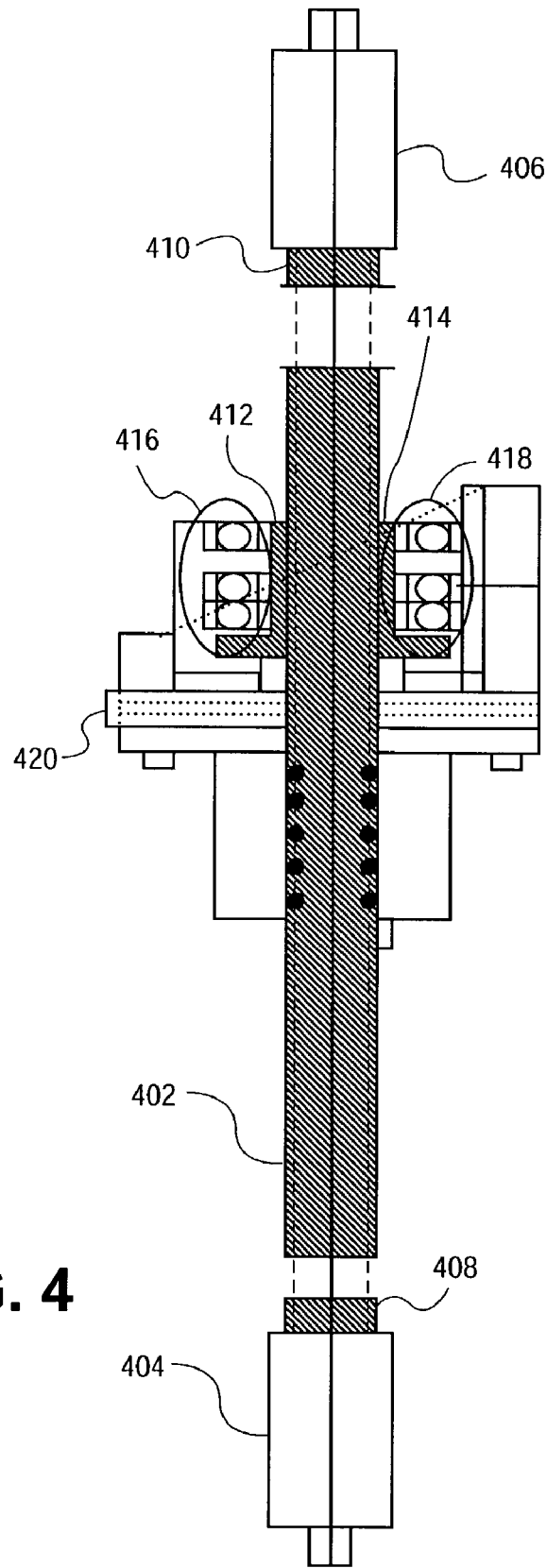
FIG. 4 is a diagram of a side view of a part of a load port transfer system according to an embodiment of the invention. The load port transfer system of FIG. 4 includes one or more vibration-dampening bases.

FIG. 4 shows a side view of part of a load port transfer system 400 according to an embodiment of the invention. The load port transfer system 400 may be implemented in conjunction with the load port transfer system 300 of FIG. 3 that has been described. The load port transfer system 400 includes a ball-type lead screw 402, vibration-dampening bases 404 and 406, a copper sleeve 412 and 414, ball bearings 416 and 418, and a belt gear 420. The copper sleeve 412 and 414 is situated around a part of the ball-type lead screw 402. The ball-type lead screw 402 is a ball-type lead screw on account of the ball bearings 416 and 418.

The vibration-dampening bases 404 and 406 can each connect the ball-type lead screw 402 to a vertical arm drive motor assembly, such as the vertical arm drive motor assembly 310 of FIG. 3. Threads of the ball-type lead screw 402 screw into corresponding threads 408 and 410 of the vibration-dampening bases 404 and 406, respectively. The vibration-dampening bases 404 and 406 act to dampen vibrations of the ball-type lead screw 402 when the vertical arm drive motor assembly is on—that is, when the vertical arm drive motor assembly has current applied thereto. The vibration-dampening bases 404 and 406 each preferably has a width greater than the width of the ball-type load screw 402.

Figure 5:
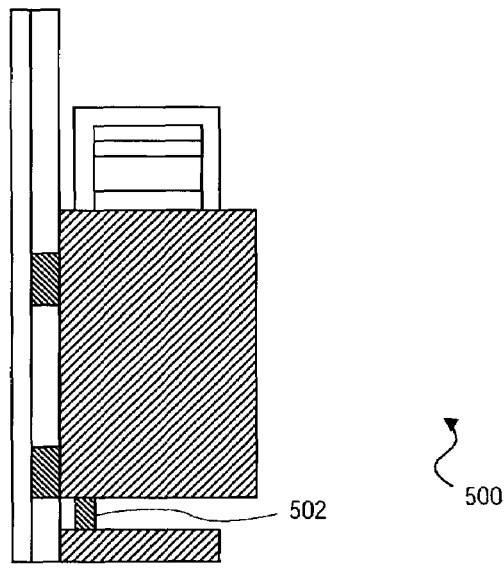
FIG. 5 is a diagram of a side view of a part of a load port transfer system according to another embodiment of the invention. The load port transfer system of FIG. 5 includes one or more assist springs.

FIG. 5 shows a side view of a load port transfer system 500 according to another embodiment of the invention. The load port transfer system 500 specifically includes one or more assist springs 502. The assist springs 502 may be located on the vibration-dampening bases of the load port transfer system 500, such as the vibration-dampening bases 404 and 406 of FIG. 4. The assist springs 502 act to avoid a vertical arm drive motor assembly from starting with too high a current. The vertical arm drive motor assembly may be the vertical arm drive motor assembly 310 of FIG. 3.

Figure 6:
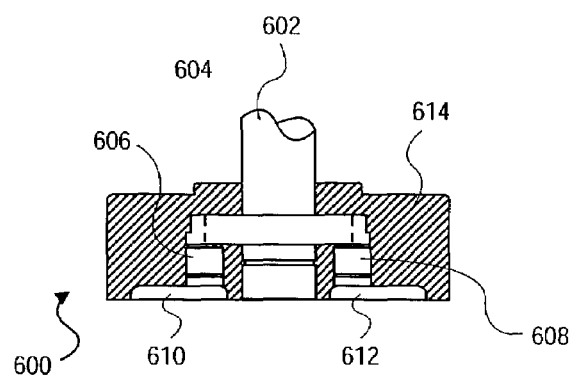
FIG. 6 is a cross-sectional diagram of a side view of a vibration-dampening base according to an embodiment of the invention. The vibration-dampening base of FIG. 6 can be used in conjunction with the load port transfer system of FIG. 4.

FIG. 6 shows a cross-sectional side view of a vibration-dampening base 600 according to an embodiment of the invention. The vibration-dampening base 600 may act as either or both of the vibration-dampening bases 404 and 406 of FIG. 4. The vibration-dampening base 600 includes a cross member 604, a left pillar member 606, a right pillar member 608, and support stands 610 and 612. These components of the vibration-dampening base 600 act to dampen vibrations of the ball-type lead screw 602 when moving, turning, or rotating as a result of a vertical arm drive motor assembly of a load port transfer system of which the base 600 and the screw 602 are a part.

The ball-type lead screw 602 is disposed within and through the cross member 604, such as threads of the former engaging with corresponding threads of the latter. The cross member 604 is supported by the right pillar member 608 and the left pillar member 606. The pillar members 606 and 608 are themselves supported by support stands 610 and 612, respectively. An enclosure 614 encases the cross member 604, the pillar members 606 and 608, and the support stands 610 and 612.

Figure 7:
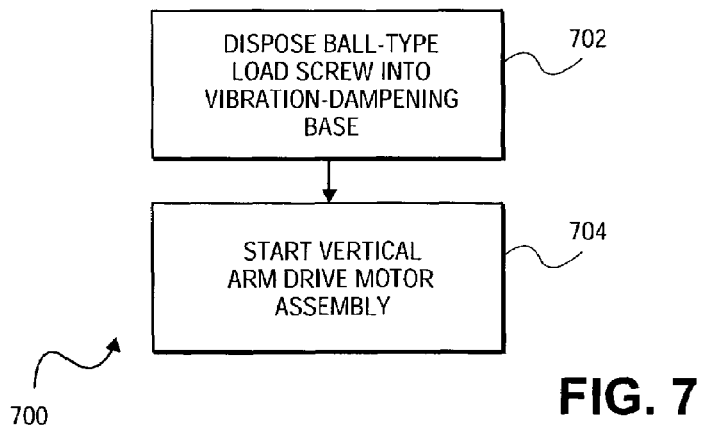
FIG. 7 is a flowchart of a method according to an embodiment of the invention.

FIG. 7 shows a method 700 according to an embodiment of the invention. First, a ball-type lead screw of a load port transfer system is disposed into a vibration-dampening base (702). Next, a vertical arm drive motor assembly of the load port transfer system that is connected to the ball-type lead screw through the vibration-dampening base is started (704). An assist spring, which is preferably part of the vibration-dampening base, prevents current of the vertical arm drive motor assembly from starting too high. Furthermore, the vibration-dampening base dampens vibrations of the ball-type lead screw. In this way, reliability and operating lifetime of the load port transfer system, and specifically the ball-type lead screw, are improved and lengthened. Furthermore, damage to the semiconductor wafers and/or the cassettes that carry the semiconductor wafers that the load port transfer system is transporting is maximally avoided.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A load port transfer system to transfer semiconductor wafer cassettes from pods of a pod transport system to a process tool load position, comprising:
   a vertical arm drive motor assembly;
   a ball-type lead screw, lowering and raising thereof controlled by the vertical arm drive motor assembly to cause a platform to rise and descend, the semiconductor wafer cassettes positionable on the platform;
   a vibration-dampening base connecting the vertical arm drive motor assembly to the ball-type lead screw; and
   one or more assist springs to prevent a current of the vertical arm drive motor assembly from starting too high.

2. The system of claim 1, wherein the vibration-dampening base comprises threads receptive to corresponding threads of the ball-type lead screw.

3. The system of claim 1, wherein the vibration-dampening base has a width greater than a width of the ball-type lead screw.

4. The system of claim 1, wherein the vibration-dampening base comprises a cross member into which the ball-type lead screw is disposed.

5. The system of claim 4, wherein the vibration-dampening base further comprises one or more pillar members supporting the cross member.

6. The system of claim 5, wherein the vibration-dampening base further comprises one or more support stands, each stand supporting a corresponding one of the one or more pillar members.

7. The system of claim 6, wherein the vibration-dampening base further comprises an enclosure encasing the cross member, the one or more pillar members, and the one or more support stands.

8. The system of claim 1, wherein the ball-type lead screw comprises a copper sleeve.

9. The system of claim 1, wherein the ball-type lead screw comprises a plurality of ball bearings.

10. The system of claim 1, wherein the ball-type lead screw comprises a bell gear.

11. A vibration-dampening base for a ball-type lead screw of a load port transfer system for transferring semiconductor wafer cassettes from pods of a pod transport system to a process tool load position, comprising:
- a cross member into which the ball-type lead screw is disposed, lowering and rising of the ball-type lead screw causing a platform to rise and descend, the semiconductor wafer cassettes positionable on the platform;
- one or more pillar members supporting the cross member; and,
- one or more support stands, each stand supporting a corresponding one of the one or more pillar members.

12. The base of claim 11, further comprising an enclosure encasing the cross member, the one or more pillar members, and the one or more support stands.

13. The base of claim 11, further comprising one or more assist springs to prevent a current of a vertical arm drive motor assembly of the load port transfer assembly from starting too high.

14. The base of claim 11, wherein the cross member has threads receptive to corresponding threads of the ball-type lead screw.

15. The base of claim 11, wherein the base has a width greater than a width of the ball-type lead screw.

16. The base of claim 11, further comprising one or more assist springs.

17. A method comprising:
- disposing a ball-type lead screw of a load port transfer system into a vibration-dampening base, the load port transfer system adapted to transferring semiconductor wafer cassettes from pods of a pod transport system to a process tool load position; and,
- starting a vertical arm drive motor assembly of the load port transfer system connected to the ball-type lead screw through the vibration-dampening base, the vertical arm drive motor assembly controlling lowering and raising of the ball-type lead screw to cause a platform to rise and descend, the semiconductor wafer cassettes positionable on the platform,
- an assist spring of the vibration-dampening base preventing current of the vertical arm drive motor assembly from starting too high,
- the vibration-dampening base dampening vibrations of the ball-type lead screw.

18. The method of claim 17, wherein the vibration-dampening base has a width greater than a width of the ball-type lead screw.

19. The method of claim 17, wherein the vibration-dampening base has threads receptive to corresponding threads of the ball-type lead screw.

* * * * *